United States Patent
Okamoto et al.

(10) Patent No.: US 6,589,435 B1
(45) Date of Patent: Jul. 8, 2003

(54) PLASMA ETCHING METHOD

(75) Inventors: Shin Okamoto, Kofu (JP); Shunichi Iimuro, Kitakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/674,482

(22) PCT Filed: Apr. 16, 1999

(86) PCT No.: PCT/JP99/02043

§ 371 (c)(1),
(2), (4) Date: Nov. 8, 2000

(87) PCT Pub. No.: WO99/59198

PCT Pub. Date: Nov. 18, 1999

(30) Foreign Application Priority Data

May 8, 1919 (JP) .............................. 10-140413

(51) Int. Cl.⁷ .......................................... H01L 21/3065
(52) U.S. Cl. .............................. 216/39; 216/67; 216/79; 438/733; 438/738; 438/743
(58) Field of Search ................ 216/39, 49, 67, 216/79; 438/733, 738, 743

(56) References Cited

U.S. PATENT DOCUMENTS 5,658,425 A * 8/1997 Halman et al. ............ 438/620
5,710,078 A * 1/1998 Tseng ......................... 438/620
5,908,320 A * 6/1999 Chu et al. ................... 438/743

FOREIGN PATENT DOCUMENTS

| JP | 4-152521 | 5/1992 |
| JP | 5-905225 | 4/1993 |
| JP | 6-13354 | 1/1994 |
| JP | 7-22393 | 1/1995 |

* cited by examiner

Primary Examiner—Shrive P. Beck
Assistant Examiner—Allan Olsen
(74) Attorney, Agent, or Firm—Oblon, Spivak, McClelland, Maier & Neustadt, P.C.

(57) ABSTRACT

Contact holes (36a, 36b) are formed by means of plasma etching, such that the contact holes are formed from the top surface of a silicon oxide insulating film (31) down to a wiring layer (33a) at a deep position and a wiring layer (33b) at a shallow position, respectively, which are embedded in the insulating film (31). A process gas containing $C_4F_8$, CO, and Ar is used, while the process pressure is set to be from 30 to 60 mTorr, and the partial pressure of the $C_4F_8$ gas is set to be from 0.07 to 0.35 mTorr. Under these conditions, the process gas is turned into plasma, and the insulating film (31) is etched with the plasma to form the contact holes (36a, 36b).

11 Claims, 3 Drawing Sheets

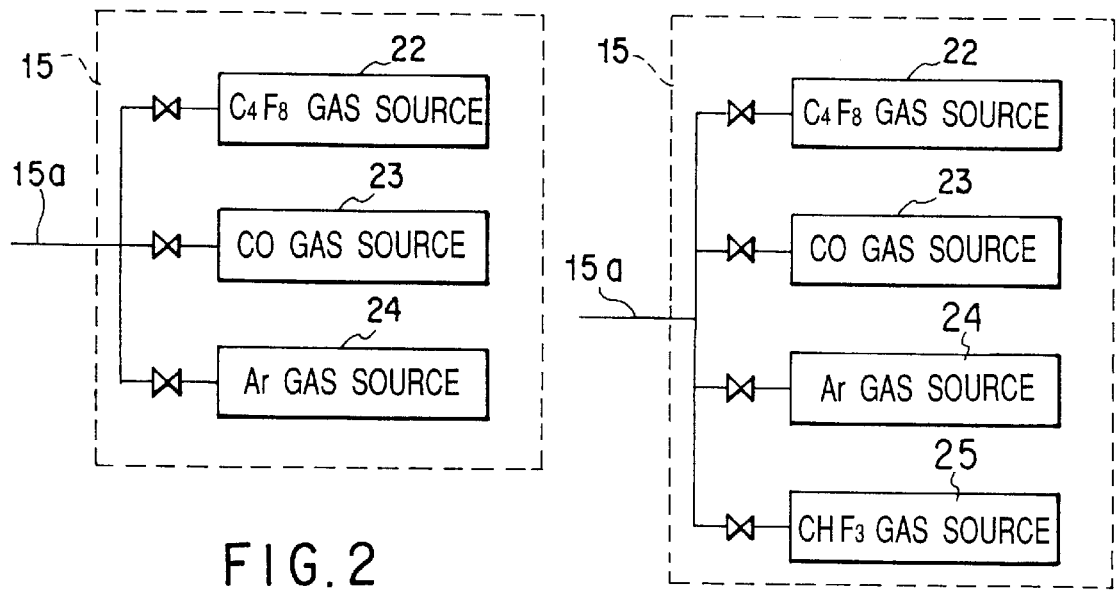
FIG. 2
FIG. 3
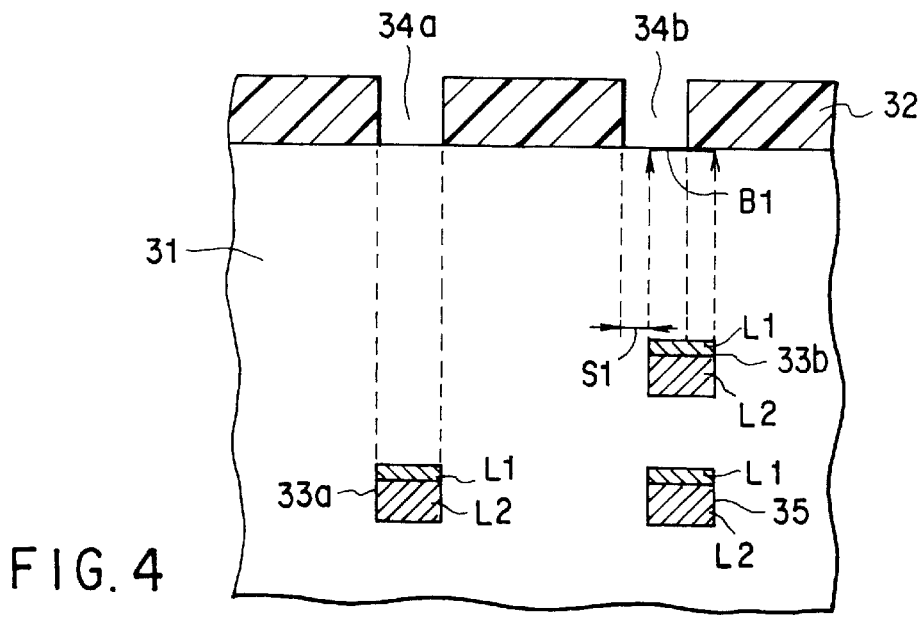
FIG. 4

PLASMA ETCHING METHOD

BACKGROUND OF THE INVENTION

1. Field of the Invention

The present invention relates to a method of forming holes, by means of plasma etching, in an insulating film, which consists essentially of silicon oxide and is disposed on a substrate, such as a semiconductor wafer. The holes are formed from the top surface of the insulating film down to wiring layers, which are embedded in the insulating film and located at different depths from the top surface.

2. Discussion of the Background

For processes of manufacturing semiconductor devices, wiring structures have become multi-wiring layer structures, in response to a recent demand that the devises should have high density and high integrity. Accordingly, techniques for electrical inter-connection among layers have become important, in relation to a contact hole for connecting a lower semiconductor to an upper wiring layer, and a via-hole for connecting upper and lower wiring layers to each other.

In these kind of techniques, wiring layers are becoming minute, and thus are increasingly required to be thinner. For this reason, some conditions need to be considered when via-holes or contact holes are formed, relative to wiring layers, by etching. For example, as shown in FIG. 6, there are cases where the diameter of an opening 103 for a contact hole is larger than the width of a wiring layer 102, and where an opening 105 for a hole is located at a position slightly shifted from a wiring layer 104 due to mask shifting. Furthermore, as shown in FIG. 7, there is a case where wiring layers are disposed on different levels on the basis of the influence of the underlying layer. In FIGS. 6 and 7, reference symbols 101 and 106 denote a silicon oxide insulating film and a resist pattern, respectively.

As shown in FIG. 7, where wiring layers are present at different depths in an inter-level insulating film, and a contact hole is slightly shifted from the wiring layer at the shallower position, over-etching is caused on the wiring layer 108 at the shallower position when etching is performed down to the wiring layer 107 at the deeper position. In this case, that part of the insulating film adjacent to the wiring layer 108 at the shallower position is etched, and there may be formed a short-circuit between the wiring layer 108 and a wiring layer 109 thereunder

SUMMARY OF THE INVENTION

An object of the present invention is, in a plasma-etching method of forming holes relative to wiring layers present at different depths in an insulating film, to reliably etch the insulating film down to the wiring layer at the deeper position, and to prevent that part of the insulating film adjacent to the wiring layer at the shallower position from being over-etched.

In light of this object, the present inventors conducted experiments on processes of anisotropically etching an insulating film of silicon oxide, while using plasma of a process gas including a fluorocarbon-containing gas, such as $C_4F_8$ gas or $C_5F_8$ gas, to form holes in the insulating film. As a result, the present inventors have found that, where the ratio of a fluorocarbon-containing gas, such as $C_4F_8$ gas or $C_5F_8$ gas, relative to the whole process gas is extremely low as compared to conventional values, it is possible to reliably etch the insulating film down to a wiring layer at a deeper position, and to prevent that part of the insulating film adjacent to a wiring layer at a shallower position from being over-etched.

According to a first aspect of the present invention, there is provided a method of forming first and second holes, by means of plasma etching, in an insulating film, which consists essentially of silicon oxide and is disposed on a substrate, such that the first and second holes are formed from a top surface of the insulating film down to first and second wiring layers, which are embedded in the insulating film and located at different depths from the top surface, the method comprising the steps of:

placing the substrate in an airtight process chamber;

supplying a process gas comprising a fluorocarbon-containing gas into the process chamber, while exhausting the process chamber; and turning the process gas into plasma, and anisotropically etching the insulating film with the plasma, wherein, in the process of anisotropically etching the insulating film, the process chamber is set to have an inside pressure of from 30 to 60 mTorr, and the fluorocarbon-containing gas is set to have a partial pressure of from 0.07 to 0.35 mTorr in the process chamber.

In the present invention, the ratio of the fluorocarbon-containing gas in the process gas is set low, whereby etching deposits onto the wiring layer at the shallower position increase, so that the etching is prevented from proceeding beyond the wiring layer at the shallower position. Where the partial pressure of the fluorocarbon-containing gas is set to fall in the above described range, etching the insulating film down to the wiring layer at the deeper position is ensured. Typically, the fluorocarbon-containing gas consists of $C_4F_8$ gas or $C_5F_8$ gas.

Where the process gas contains CO, the CO reacts with F, which is one of the etching residues, to form a compound, and then the compound is exhausted out of the system. As a result, the etching selectivity increases, while deposited C is dissolved to accelerate the etching. Where the fluorocarbon-containing gas consists of $C_4F_8$ gas or $C_5F_8$ gas, the flow ratio of the CO gas relative to the $C_4F_8$ gas or $C_5F_8$ gas is preferably set to be from 35 to 200. With this condition, it is ensured to etch the oxide film down to the wiring layer at the deeper position, while preventing the insulating film from being over-etched around the wiring layer at the shallower position.

Where the process gas contains a hydrogen-containing gas, it is possible to accelerate the etching reaction to increase the etching rate. For example, where $CHF_3$ gas or $CH_2F_2$ gas is used as the hydrogen-containing gas, and the composition ratios of the process gas are appropriately adjusted, the etching rate is increased by 20% or more, as compared to a case where the hydrogen-containing gas is not contained.

Where the fluorocarbon-containing gas consists of $C_4F_8$ gas or $C_5F_8$ gas, and the hydrogen-containing gas consists of $CHF_3$ gas or $CH_2F_2$ gas, the flow ratio of the hydrogen-containing gas relative to the fluorocarbon-containing gas is preferably set to be from 1 to 5. Where the flow ratio is more than five, the etching is disturbed by an excessive amount of the hydrogen-containing gas, and may not reach the wiring layer at the deeper position. On the other hand, where the flow ratio is less than one, the effect of the added hydrogen-containing gas is not sufficiently exhibited.

The process gas preferably further contains an inactive gas.

The present invention is particularly effective in a case where the second wiring layer is located at a position shallower than that of the first wiring layer, and the opening of the second hole on the surface of the insulating film is set to overlap with the orthogonal projection of the second wiring layer on the surface of the insulating film by a degree of not less than one-fourth but less than one times the area of the opening. Where this area ratio is one-fourth or more, the etching is easily stopped at the wiring layer at the shallower position. Where the orthogonal projection of the second wiring layer and the opening of the second hole completely overlap with each other, the insulating film around the wiring layer at the shallower position is never etched downward beyond it. Accordingly, only the case where the area ratio is less than one needs to be carefully considered.

Where the second wiring layer is present at a position shallower than the first wiring layer, the second wiring layer may be designed to have upper and lower layers stacked one on top of the other, in which the upper layer has a higher resistance against the process gas than that of the lower layer. With this arrangement, the second wiring layer is prevented from being damaged by etching.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein:

FIG. 2 is a view showing an example of a process gas supply system;

FIG. 3 is a view showing another example of a process gas supply system;

FIG. 4 is a sectional view showing a semiconductor device used as an etching target according to an embodiment of the present invention;

DESCRIPTION OF THE PREFERRED EMBODIMENT

Figure 1:
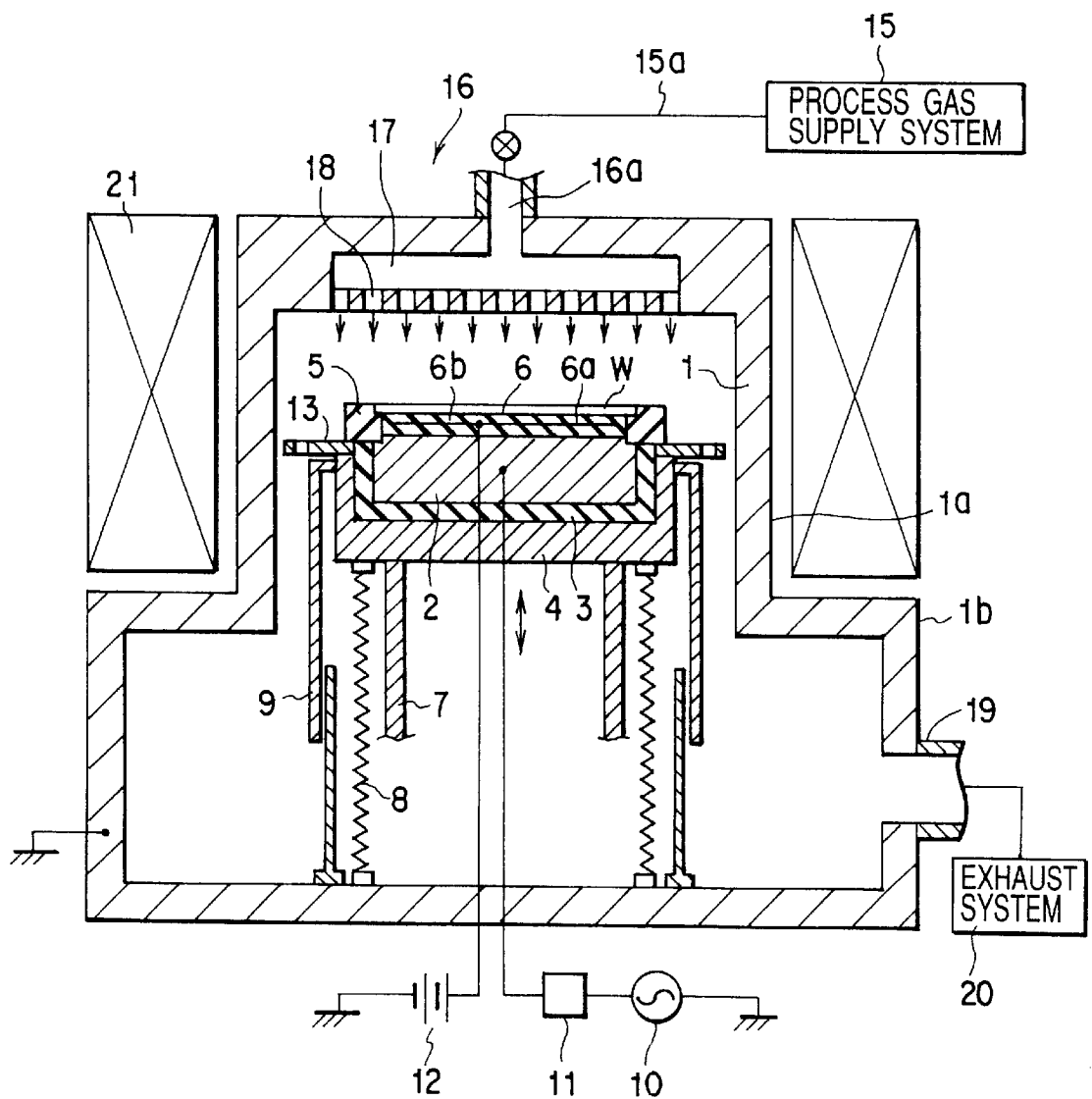
FIG. 1 is a sectional view showing a plasma etching apparatus for practicing a plasma etching method according to an embodiment of the present invention.

FIG. 1 is a sectional view showing a plasma etching apparatus for practicing a plasma etching method according to an embodiment of the present invention.

The etching apparatus includes an airtight process chamber 1 consisting of an upper portion 1a with a smaller diameter and a lower portion 1b with a larger diameter to form a cylindrical shape with a step portion. The process chamber 1 is formed of aluminum walls, which are grounded.

A support table 2 is disposed in the process chamber 1 to support a semiconductor wafer W as a target object in a horizontal state. The support table 2 is made of, e.g., aluminum, and is supported on a conductive support pedestal 4 with a ceramic insulating plate 3 interposed therebetween. A ceramic focus ring 5 is disposed around the upper portion of the support table 2.

The support table 2 and the support pedestal 4 are moved up and down by a ball-screw mechanism including a ball screw 7. The driving portion under the support table 2 is covered with a bellows 8 made of stainless steel (SUS). A coolant flow passage is formed in the support table 2 to cool the table 2. A bellows cover 9 is arranged around the bellows 8.

The support table 2 is connected to an RF power supply 10 through a matching box 11. The support table 2 is supplied with a radio frequency power of, e.g., 13.56 MHz from the RF power supply 10.

An electrostatic chuck 6 is arranged on the surface of the support table 2 to attract the semiconductor wafer W by means of electrostatic force. The electrostatic chuck 6 is formed such that insulating bodies 6b interpose an electrode 6a connected to a direct current power supply 12. When a voltage is applied from the power supply 12 to the electrode 6a, the wafer W is attracted onto the support table 2 by means of Coulomb's force.

An appropriate coolant is circulated through the flow passage (not shown) formed in the support table 2 to control the semiconductor wafer W to have a predetermined temperature. A baffle plate 13 is disposed around the insulating ring 5. The baffle plate 13 is electrically connected to the process chamber 1 through the support pedestal 4 and bellows 8.

A showerhead 16 is arranged on the ceiling plate of the process chamber 1 and faces the support table 2. The showerhead 16 has a number of gas delivering holes 18 formed on the bottom, and a gas introduction port 16a connected to the top. In the showerhead 16, a space 17 is formed to communicate with the gas introduction port 16a and the gas delivering holes 18. The gas introduction port 16a is connected to a gas supply line 15a. The other end of the gas supply line 15a is connected to a process gas supply system 15 for supplying a process gas containing a reactive gas for etching and a diluting gas.

In this embodiment, the process gas contains a reactive gas, such as $C_4F_8$ gas or $C_5F_8$ gas; CO gas; and an inactive gas, such as Ar gas or He gas, used as a carrier gas. With this process gas, an insulating film consisting mainly of silicon oxide and arranged on the wafer W is etched. Accordingly, for example, the process gas supply system 15 includes a $C_4F_8$ gas supply source 22, a CO gas supply source 23, and an Ar gas supply source 24, as shown in FIG. 2.

Furthermore, in order to increase the etching rate, the process gas may contain a hydrogen-containing gas, such as $CHF_3$ gas or $CH_2F_2$ gas. In this case, for example, as shown in FIG. 3, the process gas supply system has a configuration including a $CHF_3$ gas supply source 25 in addition to the configuration shown in FIG. 2.

The process gas is supplied from such a process gas supply system 15 through the gas supply line 15a and the gas introduction port 16a into the space 17 in the showerhead 16, and then delivered from the gas delivering holes 18.

An exhaust port 19 is formed in a sidewall of the lower portion 1b of the process chamber 1, and is connected to an exhaust system 20. A vacuum pump is arranged in the exhaust system 20 and is operated to reduce the pressure inside the process chamber 1 to a predetermined vacuum pressure.

On the other hand, a dipole ring magnet 21 is concentrically disposed around the upper portion 1a of the process chamber 1. The magnet 21 is arranged to form a magnetic field in a space between the support table 2 and the showerhead 16.

An explanation will be given of a plasma etching method according to an embodiment of the present invention, which is performed in the above-described apparatus.

A wafer used as a target object to be etched has a structure shown in FIG. 4. More specifically, on a semiconductor substrate (not shown), such as a silicon substrate, an insulating film 31 consisting mainly of silicon oxide is disposed as an inter-level insulating film to cover predetermined electrodes or wiring layers 33a, 33b, and 35. The wiring layers 33a and 33b are located at a deep position and a shallow position, respectively, and the wiring layer 35 is located directly under the wiring layer 33b. Each of the wiring layers 33a, 33b, and 35 has an upper layer L1 of TiN, and a lower layer L2 of Al, which are stacked one on top of the other.

A resist pattern 32 is disposed on the insulating film 31 and has openings 34a and 34b corresponding to contact holes to be formed in the insulating film 31. The opening 34b is shifted from the wiring layer 33b at the shallower position by a distance of S1, such that the opening 34b partly overlaps with the orthogonal projection B1 of the wiring layer 33b on the surface of the insulating film 31.

The wafer W having the wiring structure described above is first transferred into the process chamber 1 and mounted on the support table 2. Then, the process chamber 1 is exhausted by the vacuum pump of the exhaust system 20 through the exhaust port 19, and is kept at a high vacuum state of, e.g., about $10^{-6}$ Torr. After this predetermined vacuum is obtained, the process gas is supplied from the process gas supply system 15 shown in FIG. 2 into the process chamber 1 at a predetermined flow rate while the process chamber 1 is kept being exhausted, whereby the pressure inside the process chamber 1 is maintained at a predetermined value of, e.g., 30 to 60 mTorr.

The process gas consists of $C_4F_8$ gas, CO gas, and Ar gas, which are supplied from the supply sources 22, 23, and 24, then through the gas supply line 15a and the showerhead 16. The flow rate of the $C_4F_8$ gas is set to be 1 to 4 sccm, which is far smaller than a conventional rate of 10 sccm. The partial pressure of the $C_4F_8$ gas in the process chamber is set to be as low as from 0.07 to 0.35 mTorr. The flow ratio of the CO gas relative to the $C_4F_8$ gas, in the process gas to be supplied into the process chamber, is set to fall in a range of from 35 to 200.

In this state, a radio frequency power with a frequency of, e.g., 13.56 MHz, and a power of, e.g., from 500 to 2500 W, is applied to the support table 2 from the RF power supply 10. Also, a predetermined voltage is applied to the electrode 6a of the electrostatic chuck 6 from the direct current power supply 11, so that the semiconductor wafer is attracted and held by means of Coulomb's force. At the same time, the temperature of the support table 2 is preferably set to fall in a range of from 0 to 40° C.

A radio frequency electric field is generated between the showerhead 16 and the support table 2 when the radio frequency power is applied to the support table 2. In this state, a magnetron electric discharge is caused and the process gas is turned into plasma in the process space in which the wafer W is placed. The silicon insulating film 31 is etched by the plasma through the openings 34a and 34b of the resist pattern 32, thereby forming contact holes.

In this embodiment, the flow rate of $C_4F_8$ gas or fluorocarbon-containing gas is set to be 1 to 4 sccm, which is far smaller than a conventional rate of 10 sccm. The partial pressure of the $C_4F_8$ gas in the process chamber is set to be as low as from 0.07 to 0.35 mTorr. The flow ratio of the CO gas relative to the $C_4F_8$ gas, in the process gas to be supplied into the process chamber, is set to fall in a range of from 35 to 200, i.e., the ratio of the $C_4F_8$ gas relative to the CO gas ratio is very small.

Figure 5:
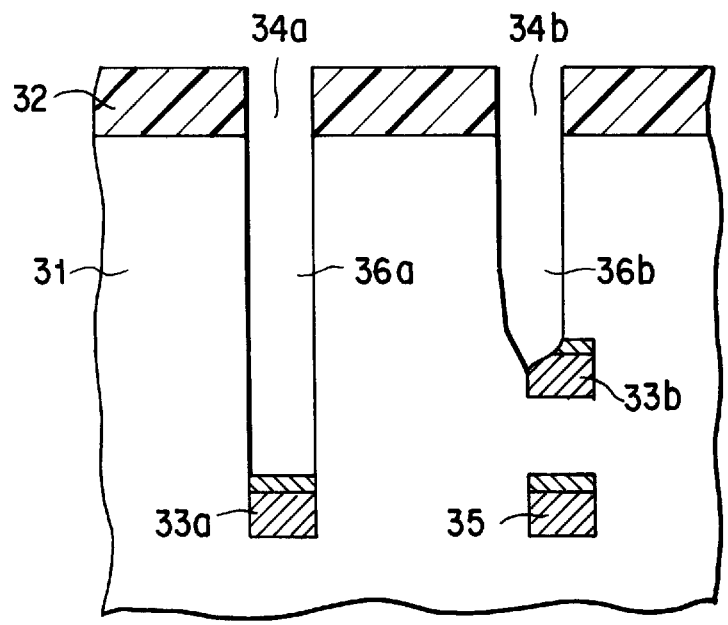
FIG. 5 is a sectional view showing a state where holes are formed in the device shown in FIG. 4.
Figure 6:
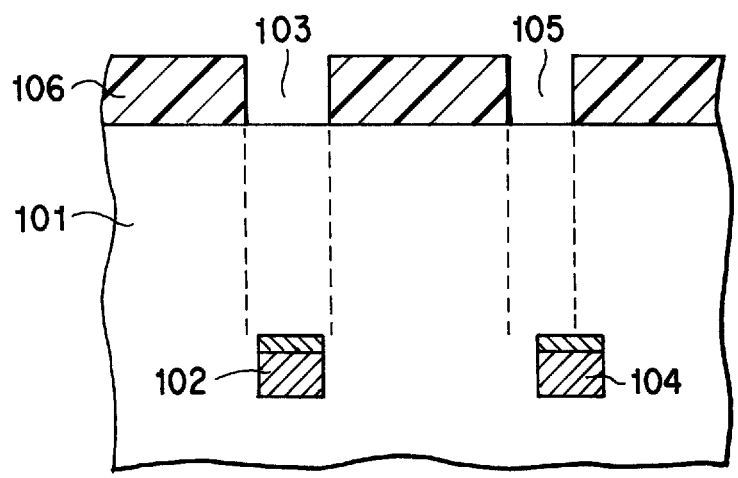
FIG. 6 is a sectional view showing states where the diameter of an opening for a hole is larger than the width of a wiring layer, and where an opening for a hole is located at a position slightly shifted from a wiring layer due to mask shifting.
Figure 7:
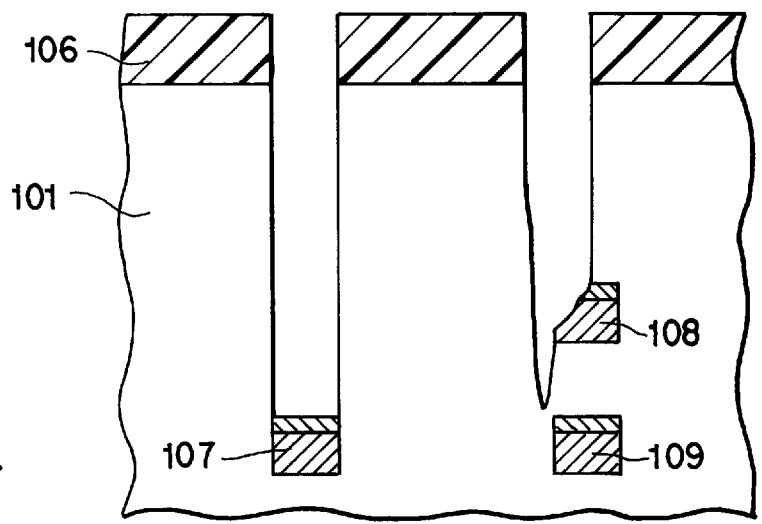
FIG. 7 is a view showing a state where etching is performed down to both wiring layers at deeper and shallower positions, and that part of an insulating film adjacent to the wiring layer at the shallower position is over-etched.

With this arrangement, the etching proceeds slowly, and is prevented from proceeding beyond the wiring layer 33b at the shallower position due to etching deposits on the wiring layer 33, such as residual products left after TiN and Al are etched. Accordingly, as shown in FIG. 5, the etching for the contact hole 36b to the wiring layer 33b at the shallower position is stopped at the wiring layer 33b, so that the wiring layer 33b is prevented from short-circuiting with the wiring layer 35 therebelow. On the other hand, even if the flow rate of the fluorocarbon-containing gas is small, the etching of silicon oxide is not stopped on the way (unsatisfactorily penetrated state), where the fluorocarbon-containing gas has a flow rate, a partial pressure, or a flow ratio relative to the CO gas falling in the range described above. As a result, the insulating film 31 is etched to the wiring layer 33a at the deeper position to form the contact hole 36a.

Note that, as described above, the process gas may further contain $CHF_3$ gas, which is a hydrogen-containing gas. In this case, a process gas supply system to be used has a configuration further including the $CHF_3$ gas supply source 25, as shown in FIG. 3. Where the $CHF_3$ gas is supplied along with the other gases into the process chamber 1, the etching reaction is accelerated to increase the etching rate. If the composition ratios of the process gas containing the $CHF_3$ gas are appropriately adjusted, the etching rate is increased by 20% or more, as compared to a case where the $CHF_3$ gas is not contained. The ratio of the $CHF_3$ gas relative to the $C_4F_8$ gas, in the process gas to be supplied into the process chamber 1, is preferably set to fall in a range of from 1 to 5. In this range, it is possible to solve a problem that the etching is disturbed by an excessive amount of the $CHF_3$ gas, or the etching is not effectively performed due to an insufficient amount of the $CHF_3$ gas.

In the device having a structure shown in FIG. 4, the shift S1 between the opening 34b and the wiring layer 33b at the shallow position should not be too large, so that the etching is stopped at the wiring layer 33b at the shallow position. More specifically, the contact hole opening 34b on the surface of the insulating film 31 is preferably set to overlap with the orthogonal projection B1 of the wiring layer 33b on the surface of the insulating film 31 by a degree of one-fourth the area of the opening or more. Furthermore, the shift S1 is preferably set to be a half the diameter of the contact hole opening 34b or less.

An explanation will be given of experiments on a plasma etching method according to an embodiment of the present invention.

In the experiments, using an apparatus having the structure shown in FIG. 1, contact holes were formed to the wiring layer 33a and 33b by etching the insulating film 31, which consists mainly of silicon oxide, in the semiconductor device shown in FIG. 4. The contact hole opening 34b on the surface of the insulating film 31 was set to overlap with the orthogonal projection B1 of the wiring layer 33b on the surface of the insulating film 31 by a degree of one-fourth the area of the opening. The pressure in the process chamber and the temperature of the support table were set at 50 mTorr and 20° C., respectively. A radio frequency power of 13.56 MHz and 1,760 W was supplied from the RF power supply while a magnetic field of 120 Gausses was formed in the process chamber 1 by the dipole magnet.

At first, in a first experiment, using as a process gas a mixture of $C_4F_8$ gas, CO gas, and Ar gas, their flow rates were changed in ranges of from 1 to 5 sccm, from 50 to 200 sccm, and from 300 to 700 sccm, respectively. More specifically, as experimental samples, the process gas was used at flow rates ($C_4F_8$ gas/CO gas/Ar gas (sccm)) of 1/200/500, 1/150/500, 1/100/500, 1/50/500, 2/150/500, 3/150/500, 4/150/500, 5/150/500, 3/150/300, 3/150/400, 3/150/600, and 3/150/700.

In the first experiment, where the flow rate (sccm) was set at 5/150/500, the etching did not stop at the wiring layer 33b at the shallow position, but proceeded to a position below the wiring layer 33b. Note that the partial pressure of the $C_4F_8$ gas and the ratio of the CO gas relative to the $C_4F_8$ gas under this condition correspond to 0.38 mTorr, and 30, respectively. On the other hand, under the other conditions, the etching stopped at the wiring layer 33b at the shallow position, and also reached the wiring layer 33a at the deep position. Furthermore, it was confirmed that the etching stopped more easily at the wiring layer at the shallow position as the amount of the CO was larger.

Then, in a second experiments, using as a process gas a mixture of $C_4F_8$ gas, CO gas, Ar gas, and $CHF_3$ gas, their flow rates were changed in ranges of from 1 to 5 sccm, from 50 to 200 sccm, and from 300 to 700 sccm, and from 3 to 18 sccm, respectively. More specifically, as experimental samples, the process gas was used at flow rates ($C_4F_8$ gas/CO gas/Ar gas/$CHF_3$ gas (sccm)) of 3/150/500/3, 3/150/500/6, 3/150/500/9, 3/150/500/12, 3/150/500/15, and 3/150/500/18.

In the second experiment, where the $CHF_3$ gas was 15 sccm or less, the etching rate tended to increase. Where the flow rate (sccm) was set at 3/150/500/6, the etching rate increased by 20% as compared to a case where $CHF_3$ gas was not added. On the other hand, however, where the flow rate of the $CHF_3$ gas was larger than this condition, the etching rate tended to decrease. Where the flow rate (sccm) was set at 3/150/500/18, the etching tended to show an unsatisfactory penetration characteristic, such that etching did not reach the wiring layer 33a at the deep position in some cases.

In another experiment using the process pressure as a parameter, the wiring layer 33b at the shallow position was prevented from being over-etched where the pressure of the process chamber fell in a range of from 30 to 60 mTorr, under conditions in that a process gas was used at a flow rate ($C_4F_8$ gas/CO gas/Ar gas (sccm)) of 3/150/500, and the temperature of the support table were set at 20° C. In still another experiment using the process temperature as a parameter, the wiring layer 33b at the shallow position was prevented from being over-etched where the temperature of the support table fell in a range of from 0 to 40° C., under conditions in that a process gas was used at a flow rate ($C_4F_8$ gas/CO gas/Ar gas (sccm)) of 3/150/500, and the pressure of the process chamber was set at 30 mTorr.

The present invention is not limited to the embodiments described above, but may be modified in various manners. For example, although the above described embodiments use $C_4F_8$ gas as a fluorocarbon-containing gas, $C_5F_8$ gas may be used instead. As an inactive gas, any one of various gases may be used in place of Ar gas. As a hydrogen-containing gas, $CH_2F_2$ gas or another gas may be used in place of $CHF_3$ gas. Furthermore, where the process gas contains $C_4F_8$ gas or $C_5F_8$ gas, the gas does not necessarily contain another specific gas.

Each of wiring layers, and particularly a wiring layer at a shallower position, is preferably designed to have upper and lower layers in which the upper layer has a higher resistance against the process gas than that of the lower layer. With this arrangement, each of the wiring layers, and particularly the wiring layer at the shallower position, is prevented from being damaged by etching.

An apparatus for performing a plasma etching method according to the present invention is not limited to the apparatus described above, but may be of another type. Besides, although the above described embodiments are explained, using a semiconductor wafer as a target substrate, the present invention may be applied to a substrate of another type, such as an LCD substrate.

What is claimed is:

1. A method of forming first and second holes, by means of plasma etching, in an insulating film, which consists essentially of silicon oxide and is disposed on a substrate, such that the first and second holes are formed from a top surface of the insulating film down to first and second wiring layers, which are embedded in the insulating film and located at different depths from the top surface, the method comprising the steps of:

placing the substrate in an airtight process chamber;

supplying a process gas comprising a fluorocarbon-containing gas into the process chamber, while exhausting the process chamber; and turning the process gas into plasma, and anisotropically etching the insulating film with the plasma, wherein, in the process of anisotropically etching the insulating film, the process chamber is set to have an inside pressure of from 30 to 60 mTorr, and the fluorocarbon-containing gas is set to have a partial pressure of from 0.07 to 0.35 mTorr in the process chamber, wherein the second wiring layer is located at a position shallower than that of the first wiring layer, and an opening of the second hole on the surface of the insulating film is set to overlap with an orthogonal projection of the second wiring layer on the surface of the insulating film by a degree of not less than one-fourth but less than one times an area of the opening, and wherein the process gas further comprises CO gas, which is set at a flow ratio of from 35 to 200 relative to the $C_4F_8$ gas or $C_5F_8$ gas.

2. The method according to claim 1, wherein the process gas further comprises CO gas.

3. The method according to claim 2, wherein the process gas further comprises a hydrogen-containing gas.

4. The method according to claim 2, wherein the process gas further comprises an inactive gas.

5. The method according to claim 1, wherein the fluorocarbon-containing gas consists of $C_4F_8$ gas or $C_5F_8$ gas.

6. The method according to claim 1, wherein the process gas further comprises $CHF_3$ gas or $CH_2F_2$ gas, which is set at a flow ratio of from 1 to 5 relative to the $C_4F_8$ gas or $C_5F_8$ gas.

7. A method of forming first and second holes, by means of plasma etching, in an insulating film, which consists essentially of silicon oxide and is disposed on a substrate, such that the first and second holes are formed from a top surface of the insulating film down to first and second wiring layers, which are embedded in the insulating film and located at different depths from the top surface, the method comprising the steps of:

placing the substrate in an airtight process chamber;

supplying a process gas comprising a fluorocarbon-containing gas into the process chamber, while exhausting the process chamber; and turning the process gas into plasma, and anisotropically etching the insulating film with the plasma, wherein, in the process of anisotropically etching the insulating film, the process chamber is set to have an inside pressure of from 30 to 60 mTorr, and the fluorocarbon-containing gas is set to have a partial pressure of from 0.07 to 0.35 mTorr in the process chamber, wherein the process gas further comprises CO gas, and the fluorocarbon-containing gas consists of $C_4F_8$ gas or $C_5F_8$ gas, and wherein the process gas further comprises CO gas, which is set at a flow ratio of from 35 to 200 relative to the $C_4F_8$ gas or $C_5F_8$ gas.

8. The method according to claim 7, wherein the process gas further comprises a hydrogen-containing gas.

9. The method according to claim 7, wherein the process gas further comprises an inactive gas.

10. The method according to claim 7, wherein the process gas further comprises $CHF_3$ gas or $CH_2F_2$ gas, which is set at a flow ratio of from 1 to 5 relative to the $C_4F_8$ gas or $C_5F_5$ gas.

11. The method according to claim 7, wherein the second wiring layer is located at a position shallower than that of the first wiring layer, and an opening of the second hole on the surface of the insulating film is set to overlap with an orthogonal projection of the second wiring layer on the surface of the insulating film by a degree of not less than one-fourth but less than one times an area of the opening.

* * * * *

UNITED STATES PATENT AND TRADEMARK OFFICE
CERTIFICATE OF CORRECTION

PATENT NO. : 6,589,435 B1
DATED : July 8, 2003
INVENTOR(S) : Okamoto et al.

It is certified that error appears in the above-identified patent and that said Letters Patent is hereby corrected as shown below:

<u>Title page,</u>
Item [30], Foreign Application Priority, information should read:
-- [30] Foreign Application Priority Data
May 8, 1998 (JP) ………………..10-140413 --

Signed and Sealed this

Fourteenth Day of October, 2003

JAMES E. ROGAN
*Director of the United States Patent and Trademark Office*